(12) United States Patent
Cohen

(10) Patent No.: US 6,556,045 B2
(45) Date of Patent: Apr. 29, 2003

(54) DIGITAL DESIGNS OPTIMIZED WITH TIME DIVISION MULTIPLE ACCESS TECHNOLOGY

(75) Inventor: Earl T. Cohen, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/826,563

(22) Filed: Apr. 4, 2001

(65) Prior Publication Data

US 2002/0175702 A1 Nov. 28, 2002

(51) Int. Cl.[7] .......................... G06F 7/38; H03K 19/173
(52) U.S. Cl. ............................................ 326/46; 326/62
(58) Field of Search ............................. 326/27, 38, 46, 326/62; 327/407; 375/332; 714/726, 729, 731

(56) References Cited

U.S. PATENT DOCUMENTS

| | | | | |
|---|---|---|---|---|
| 6,020,760 A | * | 2/2000 | Sample et al. ................. | 326/41 |
| 6,265,930 B1 | * | 7/2001 | Walker et al. ................. | 327/407 |
| 6,304,099 B1 | * | 10/2001 | Tang et al. ..................... | 326/38 |
| 6,362,680 B1 | * | 3/2002 | Barnes ......................... | 327/407 |

* cited by examiner

Primary Examiner—Daniel Chang
(74) Attorney, Agent, or Firm—Campbell Stephenson Ascolese LLP

(57) ABSTRACT

A system and method for designing a digital circuit. The method includes identifying a single phase digital circuit implementing a desired function and operating at a first rate and determining a number of copies of the single phase digital circuit that are required for the digital circuit. Each copy of the single phase circuit is a phase and operates at a lesser rate wherein the sum of the lesser rates is less than or equal to the first rate. The method includes identifying the state devices within the single phase digital circuit, replacing each state device in the single phase digital circuit with a multiphase state saving device and providing control signals to each multiphase state saving device to control the reading and writing of state information for each phase into and out of a respective multiphase state saving device.

15 Claims, 3 Drawing Sheets

DIGITAL DESIGNS OPTIMIZED WITH TIME DIVISION MULTIPLE ACCESS TECHNOLOGY

TECHNICAL FIELD

The invention relates to digital circuit design.

BACKGROUND

Digital hardware designers lay out circuits to implement a given function. Often, it is desired to implement multiple copies of that function on a single integrated circuit (chip). While this can be accomplished by replicating the existing design multiple times, there are costs to that approach in terms of efficiency (as measured in area and power) and flexibility.

Particularly in the networking world where interfaces are frequently channelized (treated as multiple, separate, lower-speed interfaces), the ability to have a single chip which can carry out a task at a high rate, or which can carry out multiple copies of that task each at a lower rate, is desirable.

SUMMARY

A method and system is shown for converting a digital circuit into a time division multiple access (TDMA) design. In one aspect of the invention, each flip flop included in the design is replaced with a scannable pipelined register (SPR) cell. In another aspect, each memory element (e.g., RAM) included in the design is replaced with a state saving device (e.g., TDMA RAM).

In one aspect, the invention provides a method for designing a digital circuit and includes identifying a single phase digital circuit implementing a desired function and operating at a first rate and determining a number of copies of the single phase digital circuit that are required for the digital circuit. Each copy of the single phase circuit is a phase and operates at a lesser rate wherein the sum of the lesser rates is less than or equal to the first rate. The method includes identifying the state devices within the single phase digital circuit, replacing each state device in the single phase digital circuit with a multiphase state saving device and providing control signals to each multiphase state saving device to control the reading and writing of state information for each phase into and out of a respective multiphase state saving device.

Aspects of the invention can include one or more of the following features. The step of identifying the state devices can include identifying flip flops in the single phase digital circuit and the step of replacing each state device can include replacing each flip flop with a time division multiple access (TDMA) register cell. The step of replacing each flip flop with a TDMA register cell can include providing a state saving circuit for each phase and a phase multiplexor. Each state saving circuit can include a first multiplexor and a flip flop. The flip flop is operable to maintain state information for a given phase. The first multiplexor can be controlled by the control signals and operable to select from received data and an output of the flip flop whereby state information is maintained for each phase in a respective flip flop until a read time designated for a given phase. New data can be selectively written into a phase's respective flip flop at a designated write time for the given phase. The phase multiplexor can receive as inputs the output from each flip flop. The phase multiplexor can be controlled by the control signals and is operable to read a respective phase's data as stored in a respective flip flop in accordance with the read time for a given phase.

The method can further include determining if the digital circuit is to include a scanning input and output, and if so, the step of replacing can include replacing each flip flop with at least one scannable TDMA register cell. The step of replacing can further include providing second multiplexors for each phase. Each multiplexor can be controlled by a scanning control signal. The second multiplexors can be operable to select from the output of a flip flop of a respective phase or the output of a flip flop for a previous phase's flip flop.

The step of replacing can include providing an output flip flop. The output flip flop can receive as an input data from the phase multiplexor and can be operable to provide state output for a respective phase clocked by a clocking signal. The step of identifying the state devices can include identifying random access memory (RAM) in the single phase digital circuit. The step of replacing each state device can include replacing each RAM with a time division multiple access RAM. The step of replacing each RAM can include adding copies of the RAM, one for each phase. The step of replacing each RAM can include replacing each RAM with a wider RAM configured to store all the state information for each phase in a portion of at least one wide address location. The step of replacing the RAM can include replacing each RAM with a deeper RAM where the deeper RAM includes addressable locations for storing state information for each phase.

In another aspect, the invention provides a method of converting a single phase circuit into a TDMA circuit and includes providing a single phase circuit, identifying the state devices within the single phase circuit and replacing each state device with a multiphase state saving device.

In another aspect, the invention provides a system including a logic circuit having state logic, wherein the state logic function is provided by a multiphase state saving circuit having a selectable output phase. The system includes logic circuitry to provide selection of the output phase.

Aspects of the invention can include one or more of the following features. The logic circuitry can include at least one TDMA cell or at least one SPR cell. The step of replacing the RAM can include providing control signals associated with the writing of data into a respective phase to provide the necessary extra state for the circuit. The step of replacing the RAM can include extending an address space of the RAM using control signals associated with the writing of data into a respective phase. The RAM can be a synchronous RAM and the step of replacing the RAM can include using control signals associated with the reading of data from and the writing of data to a respective phase to extend an address space of the RAM. The step of replacing the RAM can include using control signals associated with the writing of data to a respective phase to extend the address space of the synchronous RAM and a series of flip flops on an output of the synchronous RAM to time-align output data from the synchronous RAM.

In another aspect, the invention provides a system including a logic circuit having combinatorial and state logic. The logic circuit is selectively configurable as a single phase circuit or a multi-phase circuit. The single phase circuit implements a function and operates at a first rate. Each phase of the multi-phase circuit implements the function and operates at a lesser rate wherein the sum of the lesser rates is less than or equal to the first rate. The state logic function is provided by a multiphase state saving circuit having a selectable output phase such that the plural phases can be provided in the logic circuit without having to duplicate the combinatorial logic. The system includes logic circuitry to provide selection of the output phase.

Aspects of the invention may provide one or more of the following advantages. Designs incorporating the teaching of the present invention are easily reconfigurable to run in different modes: full or partial TDMA, or as a single copy. The resulting hardware minimizes the logic area and power required to implement multiple copies of the given function. For most designs, a quad TDMA (four-way) version of the design will increase the total area of the design by less than 50% (rather than the factor of four required if the design was simply replicated). In one practical case, that of an OC-192 RAC, a Quad TDMA design only increased area by just under 25%. The resulting hardware can be produced from an existing design with purely mechanical changes (replacing all the state elements in the design), and thus preserves the existing functionality.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

A method, system and apparatus are described to convert a pre-existing digital hardware design into a TDMA (Time Division Multiple Access) design with minimal changes to the initial design. The TDMA design can run multiple copies of the original design in parallel.

In any given digital design circuit, only the state devices in the design need to be replicated to support TDMA operation-the existing combinatorial logic can be shared. There are two types of state in most circuits: flip flops (FFs) and random access memory (RAM). (In each instance where a flip flop is used herein, it may equally apply and be taken to mean a latch.) Each replicated copy of a state in a design is referred to herein as a "phase". For example, a quad TDMA design has four phases. A circuit that is capable of storing multiple states and presenting the state of a selected phase on demand is referred to herein as a state saving device. The present invention provides design guidelines for converting a single-phase digital design into a TDMA design supporting plural phases.

Figure 1:
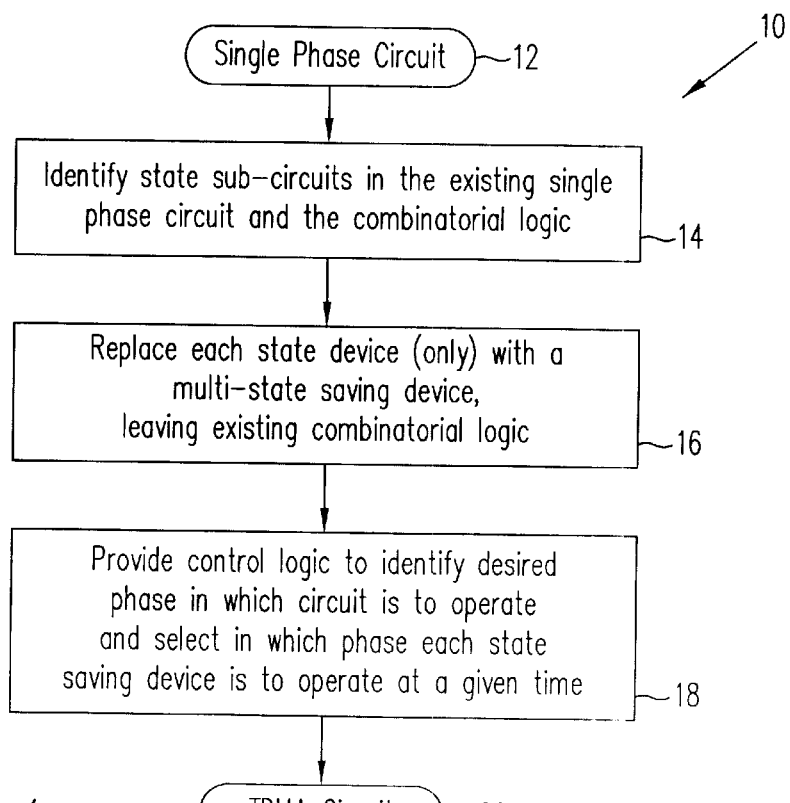
FIG. 1 is a diagram of a method for converting a single-phase logic circuit to a multi-phase TDMA circuit.

Referring to FIG. 1, a method 10 is shown to convert an existing digital logic design into a TDMA logic design. Beginning with a design for a single-phase circuit 12, the circuit is examined 14 for combinatorial logic (which need not be changed) and state devices such as flip flops. Each state device is replaced 16 by a state saving device. When all have been replaced, one or more control signals are supplied 18 to each state saving device to indicate in which phase the circuit is to operate at a given time. The number of control signals will, of course, depend upon the number of states each state saving device is designed to save: one control signal for a two phase device, two control signals for a three or four phase device, three control signals for a five, six, seven or eight phase device, and so forth. The resulting circuit (TDMA circuit 20) maintains the function of the original circuit while allowing the flexibility of operating the resultant device in a single phase (as the circuit operated originally) and also in more than one phase.

Flip Flop Replacement with SPQR Cell

Figure 2:
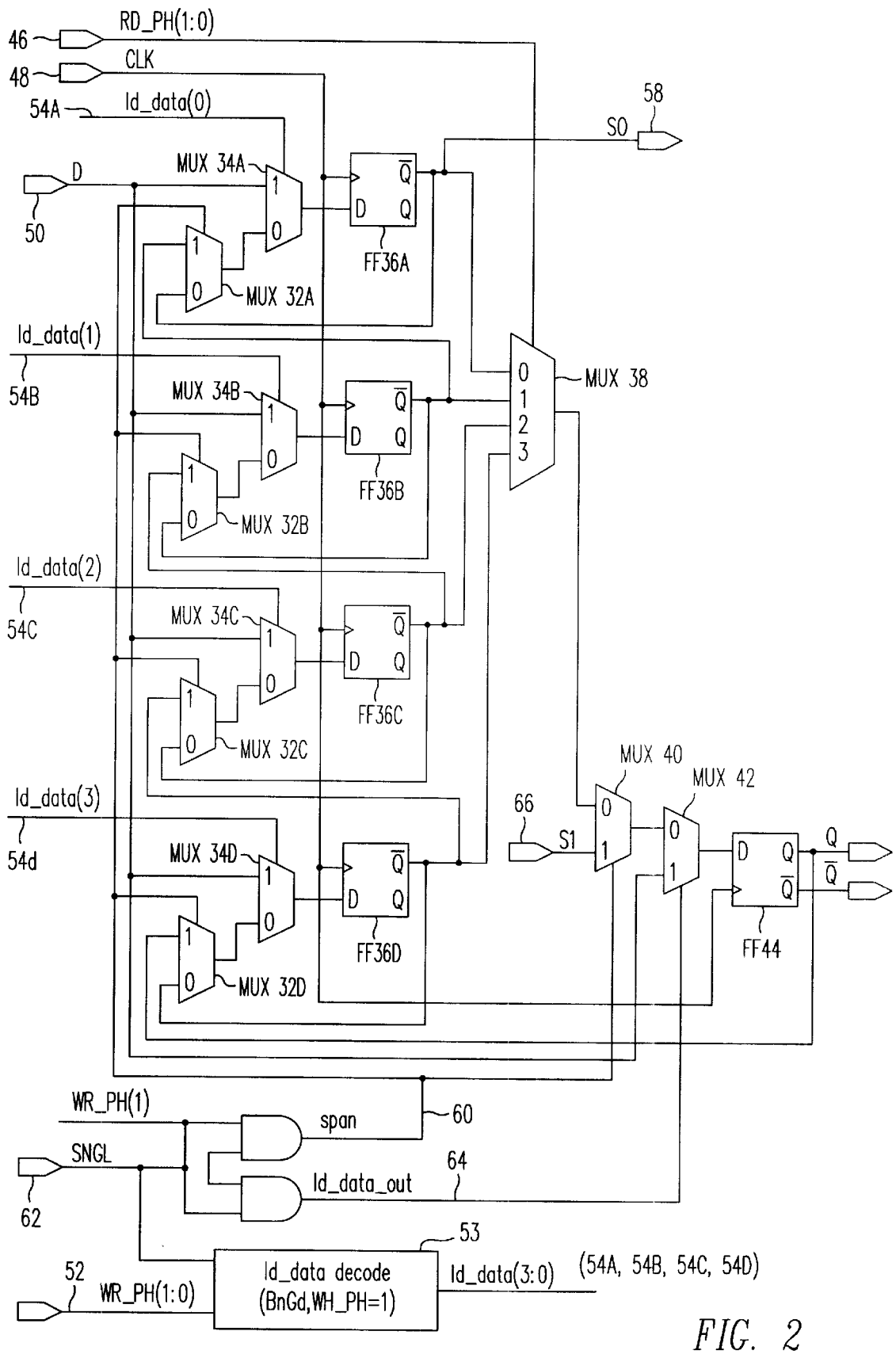
FIG. 2 is a logic diagram of a scannable pipelined quad register (SPQR)

An example of an efficient replacement state saving circuit, a scannable pipelined quad register (SPQR) cell 30, is shown in FIG. 2. While the implementation shown is a quad scannable pipelined register (SPR, or in the case of a non-scannable cell, a TDMA cell) it may be implemented in any convenient number, not only four. Each flip flop in a logic circuit can be replaced with the SPQR cell 30, providing the necessary TDMA state phases and control interfaces. Each SPQR cell 30 provides one bit of saved state per desired TDMA phase, as well as an optional output flip flop for timing purposes. The SPQR cell 30 may be implemented in any number of phases, from two upwards. Efficiencies of circuit utilization are realized when the number of saved states is a power of two, as in dual, quad or octal configurations.

The SPQR cell 30 as shown includes four replicated circuits, each including a first multiplexor 32A, a second multiplexor 34A and a flip flop FF 36. Replicated circuits are designated with a letter suffix A through D, such as MUX32B, FF36D etc, for ease of reference and understanding.

One input to SPQR 30 is a control signal (signal WR_PH 52) for controlling the phases of SPQR 30. In this implementation, the control signal consists of two data bits that are decoded by decoder 53, into four control signals Ld_data 1 through 4, 54A through 54D. Each of the four control signals (Ld_data 0 54A, Ld_data_1 54B, Ld_data 2 54C and Ld_data 3 54D) operates to select one of the inputs of a respective second mux (MUX34A through MUX 34D). When the control signal is high (logical 1 state), a respective second mux (e.g., MUX34A) passes received data from input data line D 50 to the input of a respective flip flop (e.g., FF36A), while when the control signal is held low (logical 0 state), a respective second mux (e.g., MUX 34A) passes data received from a respective first mux (e.g., MUX32A) to the flip flop, the function of which is explained below. The output data of the second mux (e.g., MUX34A) is stored in a respective flip flop (e.g., FF36A) at the active edge of the clock signal (CLK 48). Each of flip flops FF 36A through 36D is clocked using clocking signal CLK 48.

Typically (except when performing a scan operation as discussed below), a respective first mux (e.g., MUX32A) provides a feedback of the output of its respective flip flop (scan 60 held low) to its respective second mux (e.g., MUX 34A). When a second mux has its respective control signal held high, data received on input data line D 50 is passed to a respective flip flop (write mode). Alternatively, when the second mux (e.g., MUX34A) has its respective control signal held low, the output of a respective phase's flip flop (e.g., FF36A) is provided back to itself as an input (e.g., FF36A) to be maintained at the next clock active edge (assertion of CLK 48), rather than the data on input signal line D 50 (thus preserving the current state of the phase's flip flop (e.g., FF 36A)).

The output of each phase's flip flop (i.e., FF36A–FF36D) is provided as an input to output multiplexor 38. A read control signal (RD_PH (1:0)46) controls the output of output multiplexor 38. In the implementation shown, the read control signal is a two bit signal for enabling the selection from among the output multiplexor's four inputs, respectively. The output of output multiplexor 38 can be provided as an input to a scan mux 40. Scanning is described in greater detail below. Alternatively, the output of output multiplexor 38 can be provided as an input to single phase mux 42. The operation of the single phase mux 42 is described in greater detail below. In another implementation (a pipelined implementation without scan capability), the output of output multiplexor 38 is provided directly as an input to output flip flop FF 44. The use of output flip flop FF 44 is described in greater detail below. In another implementation (a non-pipelined implementation), the output of output multiplexor 38 can be provided directly as the output for SPQR cell 30. Read control signal (RD_PH (1:0)46) controls the phase read. The output of output multiplexor 38 (or in the design shown in FIG. 2, the output of output flip flop FF 44) reflects the state of the currently selected phase.

The replicated circuitry (MUX32B, MUX34B, FF36B and so forth) operates in similar fashion.

Digital circuits frequently employ a serial scan chain connecting all of their state saving elements as a means to set the state for the purpose of manufacturing testing. In the implementation shown, SPQR cell 30 minimizes global routing requirements by providing a scan (test) control function as an encoding of the single phase (SNGL 62) and write control (WR_PH 52) signals. Combinatorial logic for a scan mode is included in the example shown. For example, scan mux 40 is included to allow for the selection from between the output of one of the respective phases from output multiplexor 38 or a scan input (SI 66). A scan enable signal (SCAN 60) controls the selection of the scan mux 40 as well as the propagation of the scan input signal (SI 66) from the scan mux 38, through the single phase mux 42 and output flip flop FF 44 back through the sequence of first muxes (MUX32D through MUX32A) and finally output as part of the first phase to a scan output 58. Scan is not an essential feature of the invention. The SPQR cell 30 may be simplified by eliminating the scan MUXes (MUX32A, MUX32B, MUX32C and MuX32D) and associated controls. A non-scanning implementation would save physical circuit size, but at the expense of a more complex test strategy. Alternatively, by keeping just the final output flip flop FF 44 scannable, the full design may still be tested using a modified scan process.

In normal (non-TDMA or single phase) operation, the SPQR cell 30 acts in the same manner as a conventional flip flop. More specifically, a single phase mux (MUX 42) is provided for selecting the received data 50 as an input to the output flip flop FF 44. MUX 42 is controlled by a control signal (Ld_data_out 64) that is enabled when SPQR cell 30 is to be operated in single phase mode as indicated by the single phase control signal (SNGL 62).

In TDMA (time-sliced) operation, the SPQR cell 30 has two pipe stages-an "access" (read) stage which reads the next bit of TDMA state to be operated upon; and a following "run" (write) stage which updates the state bit just read with the results of the combinatorial logic acting upon all the states of that particular TDMA phase. For example, on clock cycle i, the state for phase 0 can be accessed (read) while the state for each of the remaining phases is maintained. On clock cycle i+1, the state for phase 1 can be read, while phase 0 runs and the updated state for phase 0 is being written. The state of a phase can be updated in a write phase with new data received on the data input line at an appropriate clock cycle (e.g., clock cycle i+1), while the state of each of the other phases is maintained in the SPQR cell 30 (by flip flops FF36A, FF36B, FF36C and FF36D, respectively).

Three global control signals are provided to control the SPQR cell 30. SNGL 62 is a single phase control signal for running SPQR 30 in single phase mode (non-TDMA). Read control signal (RD_PH[1:0]) 46 indicates the phase being accessed (read phase being accessed, nominally the next phase to run). The write phase signal (WR_PH[1:0]) 52 indicates the phase that is running (i.e., the phase currently running and writing results). The WR_PH 52 is nominally just a one cycle delayed version of the RD_PH 46.

The SPQR cell 30 may optionally include a pipelined output register (output flip flop FF 44) to make the timing for the cell very similar to that of a conventional flip flop. If the SPQR cell 30 is provided with an output flip flop FF 44, the RD_PH 46 control is not time-critical—there is a full clock cycle to read the next stage to be operated upon. Similarly, WR_PH 52 (controlling the writing of results into one phase of the SPQR cell 30) is also not time-critical. A non-pipelined SPQR cell (without the output flip flop FF 44) would save circuit layout area, at the cost of putting the access (read) multiplexor (MUX38) in the clock to-output path.

In normal quad-TDMA operation, the control signals would have the following values on consecutive clock cycles:

| SNGL | RD_PH | WR_PH |
|---|---|---|
| 0 | 0 | 3 |
| 0 | 1 | 0 |
| 0 | 2 | 1 |
| 0 | 3 | 2 |

Because WR_PH 52 is merely a one-cycle delayed version of RD_PH 46 (the phase that was accessed last cycle is running this cycle), and because RD_PH 46 is only used in the SPQR cell 30 to control output multiplexor MUX38, the RD_PH 46 control input is not strictly necessary, and may be replaced with WR_PH 52. By permuting the inputs on output multiplexor MUX38, WR_PH 52 can be used to select the state being accessed. For example, WR_PH 52 with a numerical value of 3 could be used to select state 0, WR_PH 52 with a numerical value of 0 would select state 1, and so forth. This would minimize the number of control lines needed to operate the SPQR cell 30. A conventional flip flop requires two control lines (to indicate scan mode and provide a clock); a four phase SPQR cell can be implemented with only 4 control lines (SNGL 62, WR_PH 52 (two bits), and a clock CLK 48).

The following table details the function performed by the SPQR cell based on the control signals:

| SNGL | WR_PH[1] | WR_PH[0] | FUNCTION |
|---|---|---|---|
| 0 | 0 | 0 | TDMA mode, running phase 0, accessing phase 1 |
| 0 | 0 | 1 | TDMA mode, running phase 1, accessing phase 2 |
| 0 | 1 | 0 | TDMA mode, running phase 2, accessing phase 3 |

-continued

| SNGL | WR_PH[1] | WR_PH[0] | FUNCTION |
|---|---|---|---|
| 0 | 1 | 1 | TDMA mode, running phase 3, accessing phase 0 |
| 1 | 0 | X | Single-Phase mode |
| 1 | 1 | X | Scan Mode |

The TDMA process can be round robin as disclosed above, with each phase progressing sequentially in accordance with a predefined ordering. In one implementation, SPQR cell 30 is demand driven (each phase operating as needed), or operated in uneven mode (one phase may run at a higher bandwidth than the others). In the pipelined version of the SPQR cell 30(with an output flip flop FF 44), the same phase cannot be run twice in a row (except in single phase mode). Additionally, for non-round-robin operation, RD_PH 46 is a required signal, since it may not merely be a time delayed WR_RH 52. In the non-pipelined and sequentially accessed version of the SPQR cell 30, such restrictions do not apply.

Ram and State Saving Devices

When converting a single phase circuit to a TDMA circuit, RAM addressing may need to be changed depending on the TDMA slicing. Certain address bits of the RAM are supplied by one or more bits of the WR_PH 52 signal. Depending on the application, the RAM size may need to be increased to support TDMA operation, or the RAM may be sharable (with each TDMA phase getting a portion of the original RAM). In particular, in certain channelized applications in which RAMs are used as data buffers, lower-speed interfaces (that is, time divided) need less data storage. Thus a design can often be converted to a TDMA version without having to increase all the RAM sizes. WR_PH 52 indicates the TDMA phase that is running and is hence used to distinguish the multiple phases stored in the quad phase RAM. Because WR_PH 52 indicates the running TDMA phase, with an asynchronous RAM it can be used to provide the phase selection for either a write or read address, depending on the state of write enable WE 72.

There are beneficial economies of scale with TDMA RAMs, even if the RAM size must be increased n times (where n is the total number of TDMA phases). A TDMA RAM is much more efficient (in terms of circuitry required and physical circuit real estate requirements) than replicating n copies of the original RAM design.

Figure 3A:
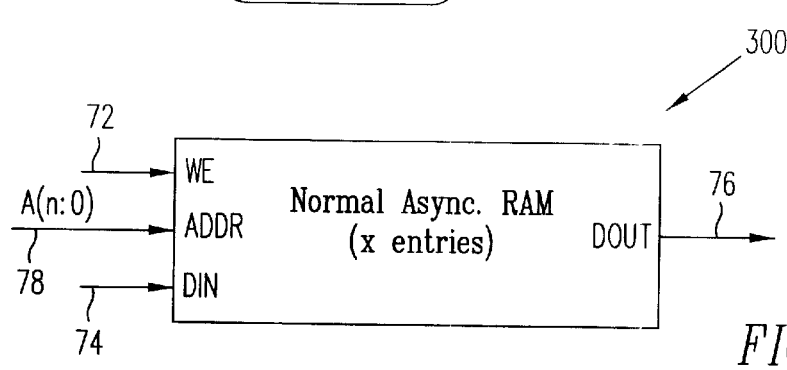
FIGS. 3A and 3B show an asynchronous RAM.
Figure 3B:
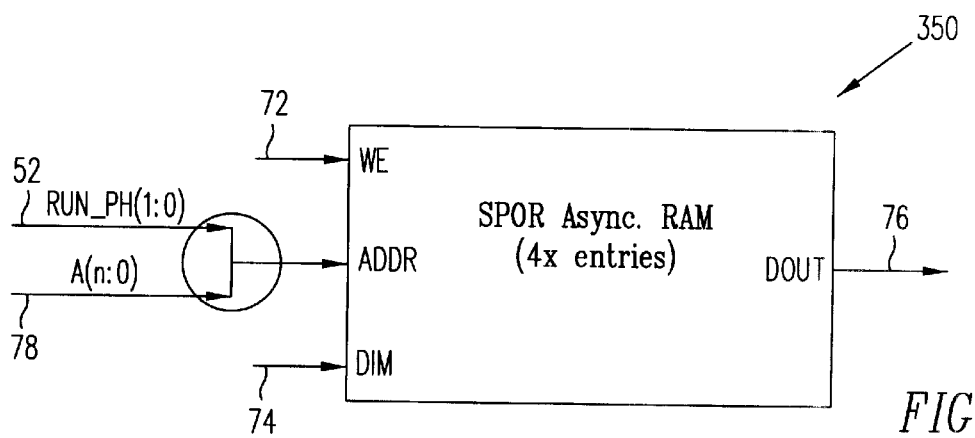

Referring to FIG. 3A, a conventional single phase asynchronous RAM 300 is shown having signals write enable WE 72, data in DIN 74, data out DOUT 76 and address ADDR 78. To convert RAM 300 to a state saving device for a quad phase circuit, the address space must simply be quadrupled. Referring to FIG. 3B, a quad phase RAM 350 is shown. Addressing for the quad phase RAM 350 is accomplished by adding WR_PH 52 (which in the case of a quad state saving device is a two bit signal) to the addressing signals. The WR_PH 52 control signal becomes additional address bits to the RAM so that each TDMA phase has its own state in the RAM.

The asynchronous RAMs, as shown, use additional address bits (the WR_PH signal 52) to provide the necessary extra state-that is, they increase the depth of the RAM. Alternatively, the necessary extra state information for the respective phases can be realized by increasing the width of the RAM, and providing external multiplexing (similar to the access multiplexor MUX38 in SPQR cell 30).

Figure 4A:
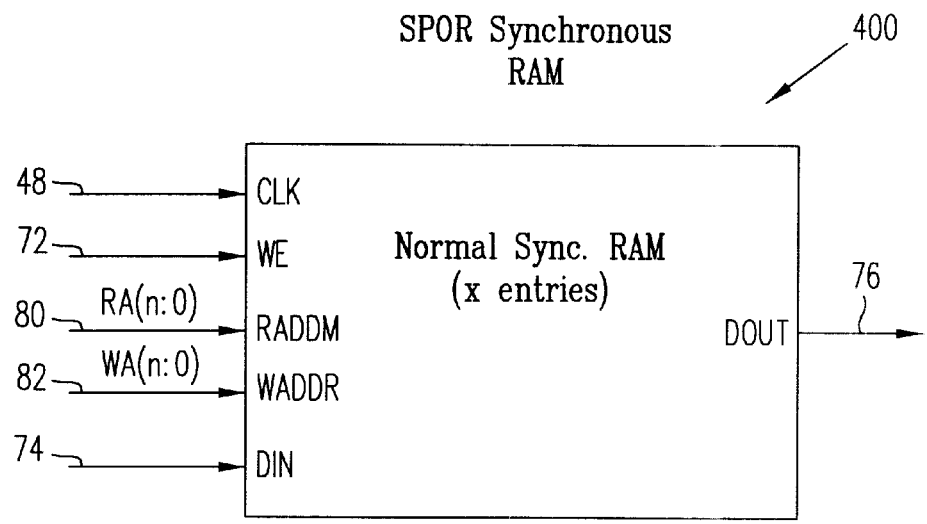
FIGS. 4A and 4B show a synchronous RAM.
Figure 4B:
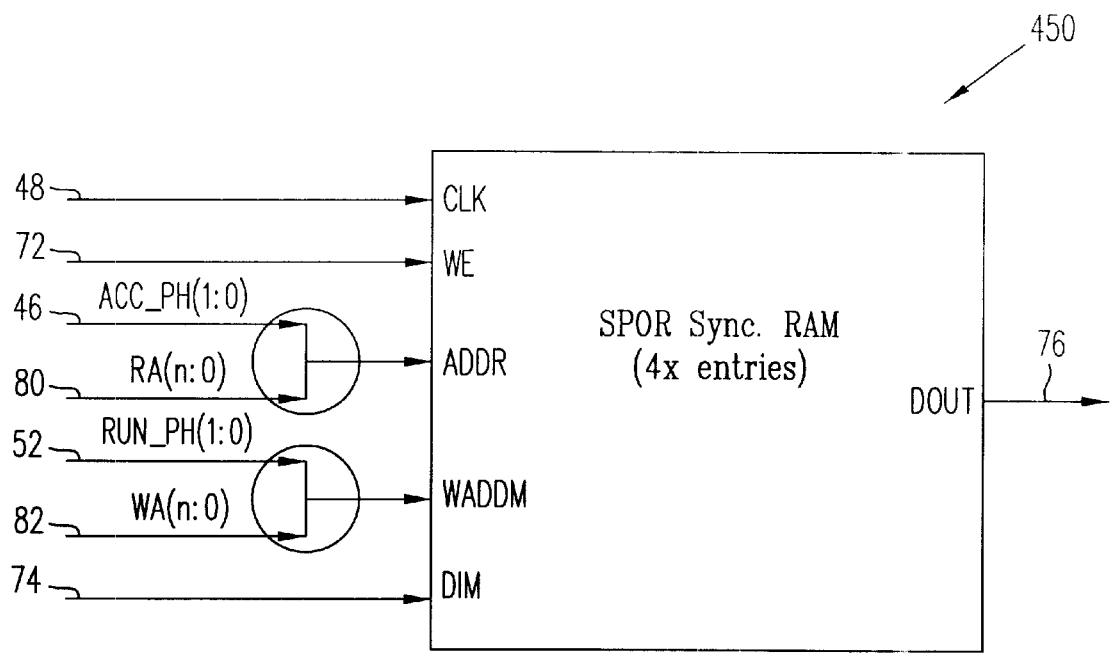

Referring to FIG. 4b, a conventional synchronous RAM 400 is shown (i.e. with registered inputs and combinatorial output). The synchronous RAM 400 can be operated in a manner similar to an SPQR cell 30—including operating in an access phase (when the RAM is read), and a running phase (when the RAM's output is used and results are written back to the synchronous RAM 400). Synchronous RAM 400 includes separate read address RADDR 80 and write address WADDR 82 signals. Similar to the case of the asynchronous RAM, the read and write address space of the synchronous RAM 400 must be increased with RD_PH 46 and WR_PH 52.

Referring now to FIG. 4b, a quad phase synchronous RAM 450 to be used with the SPQR cell is shown. The synchronous RAM 450 uses versions of the RD_PH 46 and WR_PH 52 control signals to extend the read and write RAM addresses. One alternative for reading synchronous RAMs is to use WR_PH 52 (rather than RD_PH 46) to read the synchronous RAM 450, and then to provide a series of staging flip flops on the output of the synchronous RAM 450 to properly time-align the output data. The number of phases of TDMA is used to select how many stages of delay are required on the output of the synchronous RAM 450 (e.g., in single phase mode, the synchronous RAM 450 output is used directly, in two-phase mode, the synchronous RAM 400 output is delayed by one flip flop before it can be used, etc.) This approach does not require the distribution of read phase signal RD_PH 46 (only the write phase signal WR_PH 52 is used).

A number of embodiments of the invention have been described. Nevertheless, it will be understood that various modifications may be made without departing from the spirit and scope of the invention. For example, as described above, scan is not an essential feature of the invention. The SPQR cell 30 may be simplified by eliminating the scan MUXes and controls, at the expense of a more involved test strategy. The SPQR circuit may be implemented using latches or flip flops to hold the TDMA state. Accordingly, other embodiments are within the scope of the following claims. The SPQR need not be implemented as merely a quad register circuit, but may be implemented in any number, most conveniently a power of two.

What is claimed is:

1. A method of converting a single phase circuit into a time division multiple access (TDMA) circuit comprising:
   providing the single phase circuit;
   identifying a plurality of state devices within the single phase circuit; and
   replacing each state device with a multiphase state saving device, wherein the identifying a plurality of state devices includes identifying flip flops in the single phase circuit and wherein the replacing each state device includes replacing each flip flop with a TDMA register cell.

2. The method of claim 1, wherein the step of replacing each flip flop with a TDMA register cell includes
   providing a state saving circuit for each phase and a phase multiplexor,
   each state saving circuit including a first multiplexor and a flip flop, the flip flop operable to maintain state information for a given phase, the first multiplexor controlled by the control signals and operable to select from received data and an output of the flip flop whereby state information is maintained for each phase in a respective flip flop until a read time designated for a given phase and whereby new data is selectively written into a phase's respective flip flop at a designated write time for the given phase, the phase multiplexor receiving as inputs the output from each flip flop, the phase multiplexor controlled by the control signals and operable to read a respective phase's data as stored in a respective flip flop in accordance with the read time for a given phase.

3. The method of claim 2, wherein the method further includes determining if the digital circuit is to include a scanning input and output, and if so, the step of replacing includes replacing each flip flop with a scannable TDMA register cell.

4. The method of claim 3, wherein the step of replacing further includes providing second multiplexors for each phase and controlled by a scanning control signal, the second multiplexors operable to select from the output of a flip flop of a respective phase or the output of a flip flop for a previous phase's flip flop.

5. The method of claim 2, wherein the method further includes determining if the digital circuit is to be pipelined, and if so, the step of replacing includes replacing each flip flop with a pipelined register cell.

6. The method of claim 2, wherein the step of replacing includes providing an output flip flop, the output flip flop receiving as an input data from the phase multiplexor and operable to provide state output for a respective phase clocked to a clocking signal.

7. A method of converting a single phase circuit into a time division multiple access (TDMA) circuit comprising:

providing the single phase circuit;

identifying a plurality of state devices within the single phase circuit; and replacing each state device with a multiphase state saving device, wherein the identifying a plurality of state devices includes identifying random access memory (RAM) in the single phase digital circuit and wherein the replacing each state device includes replacing each RAM with a time division multiple access RAM.

8. The method of claim 7, wherein the step of replacing each RAM includes adding copies of the RAM, one for each phase.

9. The method of claim 7, wherein the step of replacing each RAM includes replacing each RAM with a wider RAM configured to store all the state information for each phase in a portion of at least one wide address location.

10. The method of claim 7, wherein the step of replacing the RAM includes replacing each RAM with a deeper RAM, the deeper RAM including addressable locations for storing state information for each phase.

11. A system comprising:

a logic circuit having state logic, wherein the state logic function is provided by a multiphase state saving circuit having a selectable output phase; and logic circuitry to provide selection of the output phase, wherein the logic circuitry comprises at least one time division multiple access (TDMA) cell.

12. A system comprising:

a logic circuit having state logic, wherein the state logic function is provided by a multiphase state saving circuit having a selectable output phase; and logic circuitry to provide selection of the output phase, wherein the logic circuitry comprises at least one scannable pipelined register (SPR) cell.

13. The system of claim 11, wherein the TDMA cell is a TDMA random access memory (RAM).

14. A system comprising:

a logic circuit having combinatorial and state logic, the logic circuit selectively configurable as a single phase circuit or a multi-phase circuit, the single phase circuit implementing a function and operating at a first rate, each phase of the multi-phase circuit implementing the function and operating at a lesser rate wherein the sum of the lesser rates is less than or equal to the first rate, the state logic function provided by a multiphase state saving circuit having a selectable output phase such that the plural phases can be provided in the logic circuit without having to duplicate the combinatorial logic; and logic circuitry to provide selection of the output phase wherein the logic circuitry comprises at least one time division multiple access (TDMA) cell.

15. A system comprising:

a logic circuit having combinatorial and state logic, the logic circuit selectively configurable as a single phase circuit or a multi-phase circuit, the single phase circuit implementing a function and operating at a first rate, each phase of the multi-phase circuit implementing the function and operating at a lesser rate wherein the sum of the lesser rates is less than or equal to the first rate, the state logic function provided by a multiphase state saving circuit having a selectable output phase such that the plural phases can be provided in the logic circuit without having to duplicate the combinatorial logic; and logic circuitry to provide selection of the output phase wherein the logic circuitry comprises at least one scannable pipelined register cell.

* * * * *